US011157412B2

(12) United States Patent
La Fratta et al.

(10) Patent No.: US 11,157,412 B2
(45) Date of Patent: Oct. 26, 2021

(54) READ COMMANDS BASED ON ROW STATUS PREDICTION

(71) Applicant: Micron Technology, Inc., Boise, ID (US)

(72) Inventors: Patrick A. La Fratta, McKinney, TX (US); Dhawal Bavishi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/694,172

(22) Filed: Nov. 25, 2019

(65) Prior Publication Data

US 2021/0157732 A1    May 27, 2021

(51) Int. Cl.
| | | |
|---|---|---|
| *G06F 12/00* | (2006.01) |
| *G06F 12/0862* | (2016.01) |
| *G06F 12/0882* | (2016.01) |
| *G06F 12/02* | (2006.01) |
| *G11C 11/408* | (2006.01) |
| *G11C 7/22* | (2006.01) |
| *G11C 7/10* | (2006.01) |
| *G06F 13/16* | (2006.01) |

(52) U.S. Cl.
CPC ...... *G06F 12/0862* (2013.01); *G06F 12/0207* (2013.01); *G06F 12/0882* (2013.01); *G06F 13/1689* (2013.01); *G11C 7/1072* (2013.01); *G11C 7/222* (2013.01); *G11C 11/408* (2013.01); *G06F 2212/507* (2013.01)

(58) Field of Classification Search
CPC ............ G06F 12/0862; G06F 12/0882; G06F 12/0207; G06F 13/1689; G06F 2212/507; G11C 11/408; G11C 7/222; G11C 7/1072
See application file for complete search history.

(56) References Cited

U.S. PATENT DOCUMENTS

| | | | | |
|---|---|---|---|---|
| 8,873,329 B1* | 10/2014 | Zheng | ....................... | G11C 8/10 365/230.01 |
| 2005/0132148 A1* | 6/2005 | Arimilli | .............. | G06F 12/0215 711/154 |
| 2009/0157985 A1* | 6/2009 | Stevens | ............... | G06F 13/1668 711/154 |
| 2010/0161915 A1* | 6/2010 | Kim | ..................... | G06F 12/0215 711/154 |
| 2014/0101380 A1* | 4/2014 | Svendsen | ............ | G06F 13/1626 711/105 |
| 2019/0235788 A1* | 8/2019 | Niu | ....................... | G06F 3/0644 |

* cited by examiner

*Primary Examiner* — Arvind Talukdar
(74) *Attorney, Agent, or Firm* — Schwegman Lundberg & Woessner, P.A.

(57) ABSTRACT

Various embodiments described herein provide for selectively sending a read command, such as a speculative read (SREAD) command in accordance with a Non-Volatile Dual In-Line Memory Module-P (NVDIMM-P) memory protocol, to a memory sub-system based on a predicted row status of a given memory device (e.g., random access memory (RAM)-based cache) of the memory sub-system.

20 Claims, 8 Drawing Sheets

READ COMMANDS BASED ON ROW STATUS PREDICTION

TECHNICAL FIELD

Embodiments of the disclosure relate generally to memory sub-systems, and more specifically, relate to read commands based on predicted memory row status.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
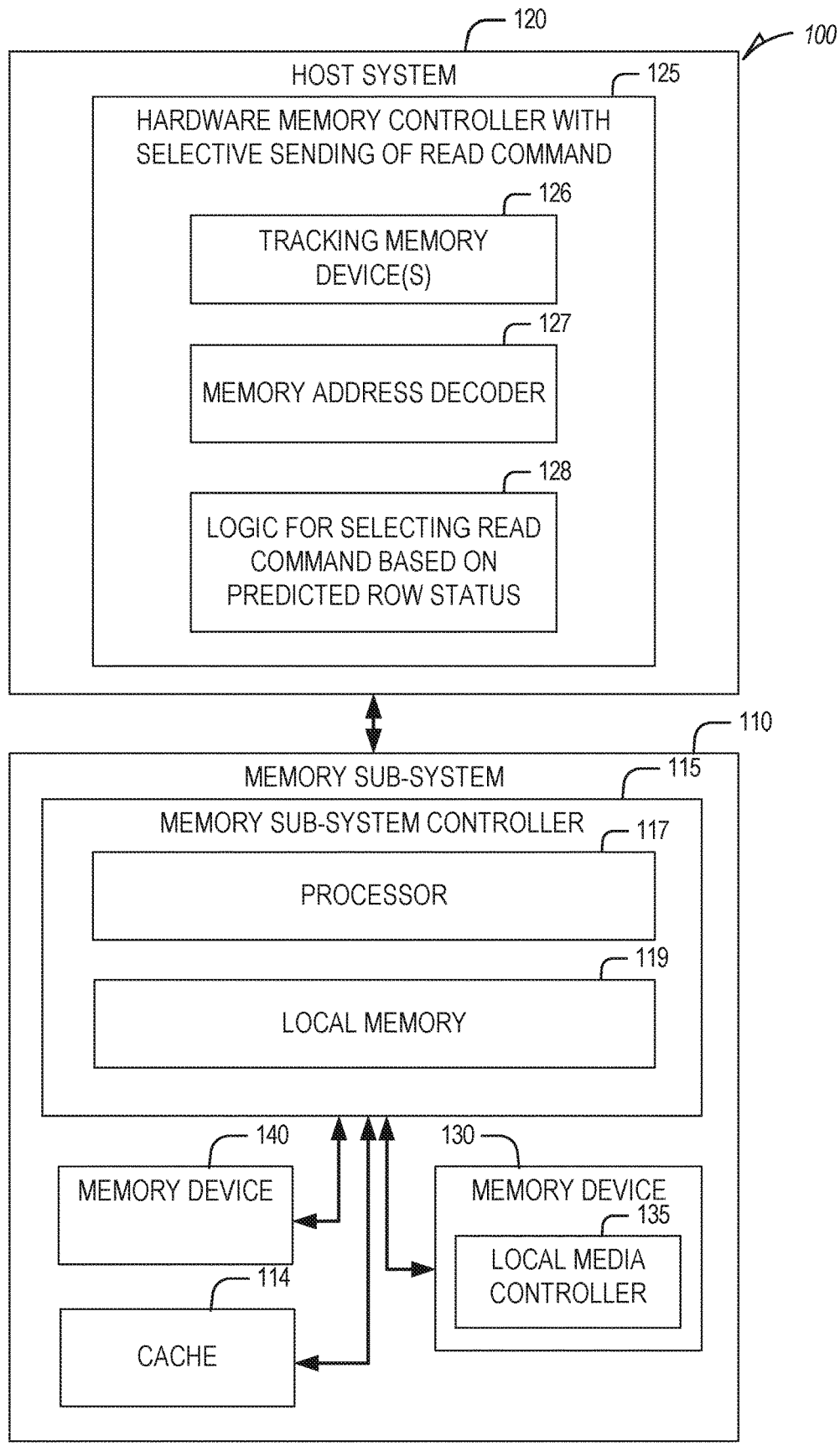
FIG. 1 illustrates an example computing environment that includes a memory sub-system, in accordance with some embodiments of the present disclosure.

Aspects of the present disclosure are directed to selectively sending a read command to a memory sub-system, such as a memory sub-system that uses a non-deterministic memory protocol a Non-Volatile Dual In-Line Memory Module-P (NVDIMM-P) memory protocol), based on a predicted row status of a memory device (e.g., random access memory (RAM)-based cache) of the memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

Some memory sub-systems use one or more random access memory (RAM) devices for temporary (e.g., cache) or longer-term data storage on a memory sub-system. For instance, where a host system is operating as a master device (or initiator device) and a memory sub-system is operating as a slave device (or target device), the memory sub-system can include (and have access to) two or more memory devices, where at least one of the memory devices is a RAM device (e.g., dynamic random access memory (DRAM) device). This RAM device can be used as a cache (e.g., read or write cache) by the memory sub-system, which can provide fast data access to a subset of data persistently stored on other memory devices of the memory sub-system. Where a RAM device is being used as a read cache (RAM read cache), when the memory sub-system receives a data read request (e.g., memory sub-system read command) from the host system, the requested data may or may not be stored (e.g., available) on the RAM read cache. Additionally, when the data is stored on a RAM read cache, the row of the RAM device holding the requested data may be open or closed. When the memory sub-system receives a cache-based memory sub-system read command, such as a speculative read (SREAD) command in accordance with a NVDIMM-P memory protocol, if the requested data is stored on an open row of the RAM read cache, this can result in (and be regarded as) a cache hit (e.g., a "SREAD hit"), and the memory sub-system can send the requested data hack to the host system quickly (e.g., within a deterministic length of time, rather than a non-deterministic length of time). On the other hand, when the memory sub-system receives a cache-based memory sub-system read command and the requested data is stored on a closed row of the RAM read cache, this can result in (and be regarded as) a cache miss (e.g., a "SREAD miss"), and the memory sub-system can send a response to the host system accordingly without the requested data back to the host system to indicate that the memory sub-system needs more time (e.g., a non-deterministic length of time) to fetch the requested data from another memory device (e.g., a memory device slower than a DRAM device) of the memory sub-system.

With particular respect to a NVDIMM-P memory protocol, where a SREAD for data at a specified memory address of the memory sub-system would result in a cache miss (e.g., because data is not stored in the RAM read cache or not stored on an open row of the RAM read cache) in connection with the RAM read cache, it would be beneficial to a send a regular read (XREAD) command for the data at the specified memory address. This can be because while an XREAD command can take a non-deterministic length of time ("non-deterministic time") to fetch data from the specified memory address and then send an indication to the host system (e.g., on the RSP_n signal line) that the data is ready to be sent to the host system, a SREAD command resulting in a cache miss can result in an extra cost (e.g., penalty) for the memory sub-system, as the memory sub-system has to respond to the host system with a cache miss (whereas an XREAD does not need to do so) and this response occupies the data bus.

Aspects of the present disclosure address the above and other deficiencies by selectively sending (e.g., issuing) a read memory sub-system command, such as an SREAD command in accordance with a NVDIMM-P memory protocol, from a host system to a memory sub-system based on a predicted row status of a given memory device (e.g., RAM read cache) of the memory sub-system. For some embodiments, the host system (e.g., a hardware memory controller of the host system) uses configuration data of the given memory device and a history of access (e.g., access log) of the given memory device of the memory sub-system by the host system (e.g., history stored on a tracking memory device of the hardware memory controller) to predict (e.g., estimate likelihood of) whether data stored at a given memory address of the memory sub-system is currently stored on an open row or a closed row of the given memory device. For some embodiments, the host system (e.g., a hardware memory controller of the host system) uses this prediction to determine which type of memory sub-system read command to send to the memory sub-system. For instance, where the given memory device is operating as a cache (e.g., RAM read cache) for the memory sub-system and host system (e.g., the hardware memory controller of the host system) receives a memory request to read requested data from a specified memory address of the memory sub-system, the host system can: predict (based on the configuration data and the stored history) whether the requested data is stored on an open row of the given memory device of the memory sub-system; and send a cache-based memory sub-system command (e.g., SREAD command) to the memory sub-system in response to predicting that the requested data is stored on an open row of the given memory device, or send a non-cache-based memory sub-system command (e.g., XREAD command) to the memory sub-system in response to predicting that the requested data is not stored on an open row of the given memory device (e.g., the row is closed, or the data is not even stored on the given memory device).

As used herein, a given memory device can comprise one or more banks, and each bank can comprise one or more rows for storing data. A row can comprise a page of a bank. With respect to a memory device, a controller of the memory device can generally keep (e.g., hold) a given row of a bank of the memory device open as long as there is an outstanding command for that given row. If there is no outstanding request to a given bank of the memory device and the memory device is in open page mode, a controller of the memory device can keep (e.g., hold) a currently open row of the given bank open for a configurable period of time ($t_{open}$) before closing it. If however there is no outstanding request to a given bank of the memory device and the memory device is in close page mode, a controller of the memory device can close a currently open row of the given bank as soon as there are no outstanding requests for the given bank.

Generally, in comparison to the use of a non-cache based read command, a cache hit (e.g., a SREAD hit) for a cache-based read command (e.g., SREAD) can result in better performance for a memory sub-system, while a cache miss (e.g., a. SREAD miss) for the cache-based read command can result in worse performance for the memory sub-system. Accordingly, compared to traditional approaches/techniques for sending cache-based read commands to a memory sub-system, the selective sending of the cache-based read command based on predicting whether requested data is stored on an open row of a memory device (e.g., RAM) operating as a cache (e.g., read cache) as described herein can improve the overall performance (e.g., read performance) of the memory sub-system.

As used herein, a cache-based memory sub-system read command can include a memory sub-system read command that causes a memory sub-system to send requested data back (e.g., send an indication that the requested data is ready to be read) in a deterministic length of time ("deterministic time") when the requested data is stored on an open row of a memory device serving as a cache ("cache memory device") of the memory sub-system. A cache-based memory sub-system read command can result in the memory sub-system sending a cache miss response if the requested data is not currently stored on the cache memory device or if the row in which it is stored on the cache memory device is not open (i.e., closed). After sending the cache miss response, the memory sub-system can, in non-deterministic (e.g., arbitrary) time, send the requested data (e.g., send an indication that the requested data is ready to be read). During that non-deterministic time, the memory sub-system can be fetching the requested data from another memory device of the memory sub-system to an open row of the cache memory device (e.g., read cache) of the memory sub-system. An example of a cache-based memory sub-system read command can include, without limitation, a SREAD command in accordance with a NVDIMM-P memory protocol.

As used herein, a non-cache-based memory sub-system read command can include a memory sub-system read command that causes a memory sub-system to send requested data back (e.g., send an indication that the requested data is ready to be read) in non-deterministic (e.g., arbitrary) time. During that non-deterministic time, the memory sub-system can be fetching the requested data from another memory device of the memory sub-system to an open row of the cache memory device (e.g., read cache) of the memory sub-system. An example of a cache-based memory sub-system read command can include, without limitation, a XREAD command in accordance with a NVDIMM-P memory protocol.

Disclosed herein are some examples of systems that can selectively send a read command to a memory sub-system based on a predicted row status of a memory device of the memory sub-system, as described herein.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type and NAND type flash memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, electrically erasable programmable read-only memory (EEPROM), and a cross-point array of non-volatile memory cells.

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LPA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120. The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a cache 114 used for caching data during execution of operations of the memory sub-system 110, such as a read operation or a write operation. The cache 114 can include a cache that is present at the frontend of the memory sub-system 110, while the memory devices 130, 140 can be present at the backend of the memory sub-system 110. Generally, the cache 114 has faster access performance than one or more of the memory devices (e.g., 130, 140) of the memory sub-system 110. For various embodiments, the cache 114 comprises a DRAM device. Additionally, for various embodiments, a hardware memory controller 125 of the host system 120 selectively sends a cache-based memory sub-system read command to the memory sub-system 110 based on predicting whether requested data is stored on an open row of the cache 114.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

The host system 120 includes a hardware memory controller 125 with selective sending of read command, which implements at least a portion of some embodiments described herein. According to some embodiments, the hardware memory controller 125 processes memory requests, such as read or write requests, generated by the processing device of the host system 120 (e.g., as the processing device executes a software application). The hardware memory controller 125 can include a hardware interface for receiving a memory request generated by a processing device of the host system 120. As shown, the hardware memory controller 125 includes one or more tracking memory devices 126, a memory address decoder 127, and a logic for selecting read command based on predicted row status logic 128. The hardware memory controller 125 can, for example, be coupled to a processing device (e.g., central processing unit (CPU)) of the host system 120. For instance, the hardware memory controller 125 can represent a north bridge chip or chipset, which can facilitate interactions between a processing device of the host system 120 and the memory sub-system 110.

At least one of the tracking memory devices 126 stores a history of access (e.g., access log) of a given memory device of the memory sub-system 110 by the hardware memory controller 125 as a result of a memory sub-system command (e.g., memory sub-system read command) sent from the hardware memory controller 125 to the memory sub-system 110 in the past. By the tracking memory devices 126, the hardware memory controller 125 can track access of the last row of each bank of the given memory device. For FIG. 1, the given memory device can include one of the cache 114 the memory device 130, or the memory device 140. The history can include one or more entries that each describes a last row accessed (by the hardware memory controller 125) for a given bank of a given memory device (e.g., the cache 114 or one of the memory devices 130, 140). A given entry in the history can include one or more channel address bits, one or more rank address bits, and one or more bank address bits that correspond to a specific bank of the given memory address, and can further include one or more row address bits corresponding to a specific row of the given memory address. For some embodiments, the history can include an entry for each bank of the given memory device. The hardware memory controller 125 can generate or update an entry for a given bank based on a memory request (e.g., for each read memory request) generated on the host system 120 (e.g., generated by a processing device of the host system 120 and received by the hardware memory controller 125). For some embodiments, configuration data of the given memory device (e.g., address map included therein) is used by the hardware memory controller 125 to translate a memory address of the memory request to a bank and a row of the given memory device, and this information is used to generate or update an entry in the history for the memory request.

Additionally, at least one of the tracking memory devices 126 can be used by the hardware memory controller 125 to store one or more memory addresses associated with one or more prior memory sub-system commands (e.g., read commands or write commands) sent to the memory sub-system 110, which is coupled to the host system 120. Depending on the embodiment, one of the prior sub-system commands can be a memory sub-system command (e.g., read, write, or some other command) that is known to result in data associated with the memory address being stored in (e.g., fetched to) a cache (e.g., the cache 114) of the memory sub-system 110. As described herein, this storage of data on the cache 114 can result in a cache hit when the hardware memory controller 125 sends a cache-based memory sub-system read command to the memory sub-system 110 and the requested data is stored on an open row of the cache 114. For some embodiments, the hardware memory controller 125 causes at least one tracking memory device 126 to store a memory address associated with a (e.g., each) memory sub-system read command sent by the hardware memory controller 125 to the memory sub-system 110. Additionally, for some embodiments, a memory address is stored on the at least one tracking memory device 126 with a timestamp, which can represent an issue time at which a memory sub-system command associated with the memory address was issued from the hardware memory controller 125 to the memory sub-system 110. According to some embodiments, a memory address stored on the at least one tracking memory device 126 indicates that data stored on the memory sub-system 110 at the memory address is likely stored on the cache 114 (e.g., read cache) of the memory sub-system 110, which in turn indicates that a cache hit can result if a cache-based memory sub-system read command (e.g., SREAD command in accordance with a NVDIMM-P memory protocol) is sent from the hardware memory controller 125 to the memory sub-system 110. For some embodiments, the at least one tracking memory device 126 includes a CAM, which can enable search of its stored data contents in a single clock cycle. For some embodiments, the at least one tracking memory device 126 stores each respective memory address as a tag on at least one of the tracking memory devices 126, where the tag can be used to identify the respective memory address. For example, the tag of a respective memory address is generated based on at least a portion of the respective memory address (e.g., tag includes front portion or an end portion of a 64-bit memory address).

Though the hardware memory controller 125 is shown as including the one or more tracking memory devices 126, for some embodiments, the one or more tracking memory devices 126 can be external to the hardware memory controller 125.

The memory address decoder 127 enables or facilitates translation (e.g., mapping) of a given memory address for a memory request, received by the hardware memory controller 125 (e.g., from a processing device of the host system 120), to a specific row of a specific bank of the given memory device. For some embodiments, the memory address decoder 127 translates the given memory address using configuration data of the given memory device. For instance, the configuration data can include an address map used by the given memory device (e.g., a controller of the given memory device, such as the local media controller 135) to map a memory address to a specific row of a specific bank of the given memory device. The address map of a given memory device can indicate how address bits correspond to various forms of data striping. For example, the address map of a given memory device can indicate one or more of the following: which one or more bits of a memory address (e.g., of a memory request received at a hardware memory controller of a host system) correspond to channel address bits of the given memory device; which one or more bits of a memory address correspond to rank address bits of the given memory device; which one or more bits of a memory address correspond to bank address bits of the given memory device; which one or more bits of a memory address correspond to bank group address bits of the given memory device; and which one or more bits of a memory address correspond to row address bits of the given memory device. Using the address map, the memory address decoder 127 can enable the hardware memory controller 125 to extract bits from a given memory address that correspond to at least one or more bank address bits and one or more row address bits, thereby facilitating translation (e.g., mapping) of the given memory address to a specific row of a specific bank of the given memory device. Using the address map, the memory address decoder 127 can also enable the hardware memory controller 125 to extract bits from a given memory address that correspond to one or more channel address bits or one or more rank address bits, which can also assist in translation of the given memory address (e.g., assist in identifying the specific bank). The address map can be a static mapping of memory addresses to rows of banks of the given memory device.

For some embodiments, the predicted row status logic 128 enables or facilitates the comparison of specified rows of a same bank of the given memory device to determine if they are the same row or different rows. According to some embodiments, with respect to two memory requests and their respective memory addresses, if the channel address bits, the rank address bits, and bank address bit extracted from the respective memory addresses are the same, then the two memory requests are to the same bank. According to some embodiments, if the two memory requests are to the same bank and one or more row address bits extracted from the respective memory addresses are the same, then the two memory requests are to the same row. Additionally, according to some embodiments, if the two memory requests are to the same bank but the row address bits extracted from the respective memory addresses are different, then the two memory requests are to different rows.

The logic for selecting read commands based on predicted row status logic 128 (hereafter, selection logic 128) enables or facilitates selection of a memory sub-system read command (e.g., a cache-based vs. non-cache-based memory sub-system read command) for requested data at a given memory address of the memory sub-system 110 based on a prediction of whether the requested data is stored on an open row of a bank of the given memory device (e.g., the cache 114, the memory device 130, or the memory device 140). For some embodiments, the selection logic 128 causes the hardware memory controller 125 to predict whether the requested data is stored on the open row of the given memory device (e.g., the cache 114) by first determining or predicting whether the requested data is even stored on the given memory device. Various methodologies can be used to perform this determination or prediction including, for example, tracking (e.g., using at least one of the tracking memory devices 126) memory addresses sent to the memory sub-system 110 by the host system 120 in connection with past memory sub-system read commands.

After the requested data is determined or predicted to be stored on the given memory device, the selection logic 128 can cause the hardware memory controller 125 to predict whether the requested data is stored on an open or closed row of the given memory device based on the configuration data and the history of access of the given memory device by the host system (e.g., bank and row access log). For instance, with respect to a current memory request (being processed by the hardware memory controller 125) to read data from a specified memory address, the selection logic 128 can cause the hardware memory controller 125 to first use the memory address decoder 127 to translate the specified memory address to a row R0 of bank B of the given memory address using the configuration data (e.g., address map) of the given memory device. Subsequently, the selection logic 128 can cause the hardware memory controller 125 to predict that the row R0 of bank B is closed if the host system 120 determines that the history (e.g., bank and row access log stored on at least one of the tracking memory devices 126) indicates that a last access of bank B by the host system 120 (e.g., access caused by a past memory sub-system read command sent from the hardware memory controller 125 to the memory sub-system 110) involves a different row (e.g., row R1) of bank B. This is because for various embodiments, if there is no outstanding command (e.g., request) for a given row of a bank of a given memory device (e.g., a conventional DRAM device), but there is an outstanding command for a different row of the same bank of the given memory device (a situation sometimes referred to as a "bank conflict"), a controller of the given memory device (e.g., local media controller 135) can immediately close the given row to service the outstanding command for the different row. Accordingly, for various embodiments, if the last access of bank B is a different row (e.g., row R1), the selection logic 128 causes the hardware memory controller 125 to predict that the given memory device (e.g., controller of the given memory device) would have to close row R0 of bank B to open the different row (e.g., R1) of bank B. If however the last access of bank B is the same row R0, the possibility remains for the selection logic 128 to cause the hardware memory controller 125 to predict that the row R0 of bank B continues to be open (e.g., depending on the page mode of the given memory device). As noted herein, storage of requested data on a closed row of a bank of a given memory device operating as a cache (e.g., cache 114) can result in a cache miss (e.g., SREAD miss) with respect to the requested data, while storage of requested data on an open row of a bank of the given memory device (e.g., cache 114) can result in a cache hit (e.g., SREAD hit) with respect to the requested data.

For some embodiments, where the given memory device (e.g., the cache 114) is in a close page mode and the history (stored on at least one of the tracking memory devices 126) indicates that the last access of bank B is to the same row R0 (or alternatively indicates a last access to bank B does not exist), the selection logic. 128 causes the hardware memory controller 125 to predict that row R0 of bank B is open if it is determined that the time between (a) the last access of row R0 of bank B by the hardware memory controller 125 (e.g., access caused by a past memory sub-system read command sent from the host system 120 to the memory sub-system 110) and (b) the current time associated with the current memory request is less than (c) a delay time ($t_{delay\_to\_close}$) indicating how long the given memory device takes to close an individual row of an individual bank of the given memory device. For some embodiments, the delay time represents the time it takes a controller of the given memory device to close an individual row of an individual bank of the given memory device after the last outstanding command is issued by the controller (e.g., the local media controller 135) to the individual bank (e.g., time between issuance of last outstanding command and issuance of a pre-charge to the individual bank to cause closure of the individual row).

For some embodiments, where the given memory device (e.g., the cache 114) is on an open page mode and the history (stored on at least one of the tracking memory devices 126) indicates that the last access of bank B is to the same row R0 (or alternatively indicates a last access to bank B does not exist), the selection logic 128 causes the hardware memory controller 125 to predict that row R0 of bank B is open if it is determined that the time between (a) the last access of row R0 of bank B by the host system 120 (e.g., access caused by a past memory sub-system read command sent from the host system 120 to the memory sub-system 110) and (b) the current time associated with the current memory request is less than (c) a sum of: a delay time ($t_{delay\_to\_close}$) indicating how long the given memory device takes to close an individual row of an individual bank of the given memory device; and an open time ($t_{open}$) indicating how long the given memory device keeps (e.g., holds) the individual row of the individual bank open, before closing the individual row, after there is no outstanding commands for the individual bank. Depending on the embodiment, the open time can be a configurable (e.g., user configurable) period of time.

Depending on the embodiment, a controller (e.g., the local media controller 135) of the given memory device can implement one or more optimizations that cause the controller to reorder and execute commands (e.g., execute the commands out-of-order) for the given memory device. For some embodiments, the selection logic 128 takes into consideration these one or more optimizations when determining whether the issuance of a memory sub-system command (e.g., memory sub-system read command) would have led to closure of a row of a bank of the given memory address. For some embodiments, this consideration can be implemented by the selection logic 128 updating the history (e.g., bank and row access log) while accounting for the one or more optimizations.

For some embodiments, the configuration data of the given memory device (provided by the memory sub-system 110) can include information indicating a page mode of the given memory device (e.g., open page mode or close page mode). The configuration data can include timing constraint information for the given memory device, such as a time needed by the given memory device (e.g., controller thereof) to determine that it has no more outstanding commands for an individual bank of the given memory device. The timing constraint information can enable hardware memory controller 125 to determine a delay time ($t_{delay\_to\_close}$) for how long the given memory device takes to close an individual row of an individual bank of the given memory device. The timing constraint information can enable the hardware memory controller 125 to determine an open time ($t_{open}$) for how long the given memory device in open page mode keeps (e.g., holds) the individual row of the individual bank open, before closing the individual row, after there is no outstanding commands for the individual bank. Depending on the embodiment, at least some (if not all) of the configuration data can be provided by the memory sub-system 110 to the host system 120 as part of a setup or discovery process (e.g., that the hardware memory controller 125 performs with the memory sub-system 110) or as part of a startup process of the memory sub-system 110.

Further details with regards to the operations of the hardware memory controller 125 are described below.

Figure 2:
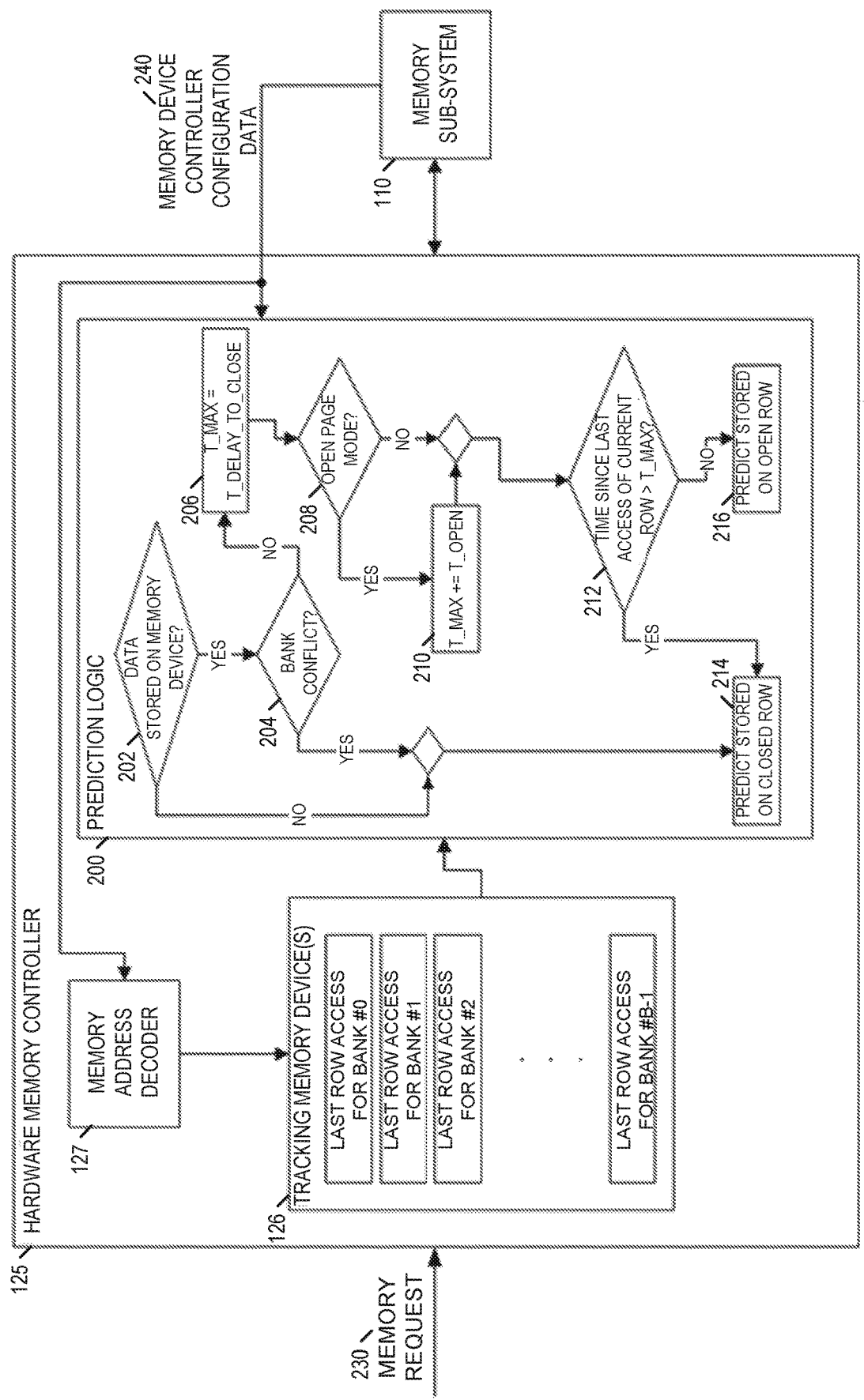
FIG. 2 illustrates an example architecture of an example hardware memory controller of a host system, in accordance with some embodiments of the present disclosure.

FIG. 2 illustrates an example architecture of the hardware memory controller 125 of the host system 120, in accordance with some embodiments of the present disclosure. In the example architecture of FIG. 2, the hardware memory controller 125 includes a prediction logic 200 that causes the hardware memory controller 125 to predict whether requested data is stored on an open row or a closed row of a given memory device of the memory sub-system 110. As shown, the one or more tracking memory devices 126 stores entries for banks 0 through B-1 of the given memory device, where each entry describes a last row accessed in connection with a specific bank of the given memory device. The hardware memory controller 125 receives, from the memory sub-system 110, configuration data 240 of a controller of the given memory device. As described herein, the memory address decoder 127 uses the configuration data 240 (e.g., address map included in the configuration data 240) to translate a memory address of a received memory request to a specific row of a specific bank of the given memory device to determine whether the specific row is different (or the same as) the last row accessed for the specific bank (as described by the history stored on at least one of the tracking memory devices 126).

During operation, the hardware memory controller 125 can receive a memory request 230. At operation 202, the prediction logic 200 causes the hardware memory controller 125 to determine or predict whether data is stored on the given memory device of the memory sub-system 110. As described herein, such a determination or prediction can be based on one or more memory addresses stored on at least one of the tracking memory devices 126, where the one or more memory addresses are associated with memory sub-system commands (e.g., memory sub-system read commands) sent from the hardware memory controller 125 to the memory sub-system 110.

If the prediction/determination is that the requested data is not stored on the given memory device, at operation 214, the prediction logic 200 causes the hardware memory controller 125 to predict that the requested data is stored on a closed row of a bank of the given memory device. If the prediction/determination is that the requested data is stored on the given memory device, at operation 204, the prediction logic 200 causes the hardware memory controller 125 to determine whether a specific row of a specific bank of the given memory address, corresponding to a specific memory address of the received memory request 230, is different from a last row accessed for the specific bank (i.e., determine whether a bank conflict exists).

If a bank conflict exists, at operation 214, the prediction logic 200 causes the hardware memory controller 125 to predict that the requested data is stored on a closed row of a bank of the given memory device. If a bank conflict does not exist, at operation 206, the prediction logic 200 causes the hardware memory controller 125 to set time $t_{max}$ to a delay time $t_{delay\_to\_close}$ that represents the time it takes a controller of the given memory device to close an individual row of an individual bank of the given memory device after the last outstanding command is issued by the controller (e.g., the local media controller 135) to the individual bank (e.g., time between issuance of last outstanding command and issuance of a pre-charge to the individual bank to cause closure of the individual row).

At operation 208, the prediction logic 200 causes the hardware memory controller 125 to determine (e.g., based on the configuration data 240) whether the given memory device of the memory sub-system 110 is in open page mode. If the given memory device of the memory sub-system 110 is in open page mode, at operation 210, the prediction logic 200 causes the hardware memory controller 125 to add, to the time $t_{max}$, an open time $t_{open}$ that indicates how long the given memory device keeps (e.g., holds) the individual row of the individual bank open, before closing the individual row, after there is no outstanding commands for the individual bank. After operation 210, operation 212 is performed. Alternatively, if the given memory device of the memory sub-system 110 is not in open page mode, operation 212 is performed after operation 206.

At operation 212, the prediction logic 200 causes the hardware memory controller 125 to determine whether a time since a last access of a current row is greater than the time $t_{max}$. If it is greater than the time $t_{max}$, at operation 214, the prediction logic 200 causes the hardware memory controller 125 to predict that the requested data is stored on a closed row of a bank of the given memory device. However, if it is less than or equal to the time $t_{max}$, at operation 216, the prediction logic 200 causes the hardware memory controller 125 to predict that the requested data is stored on an open row of a bank of the given memory device.

Figure 3:
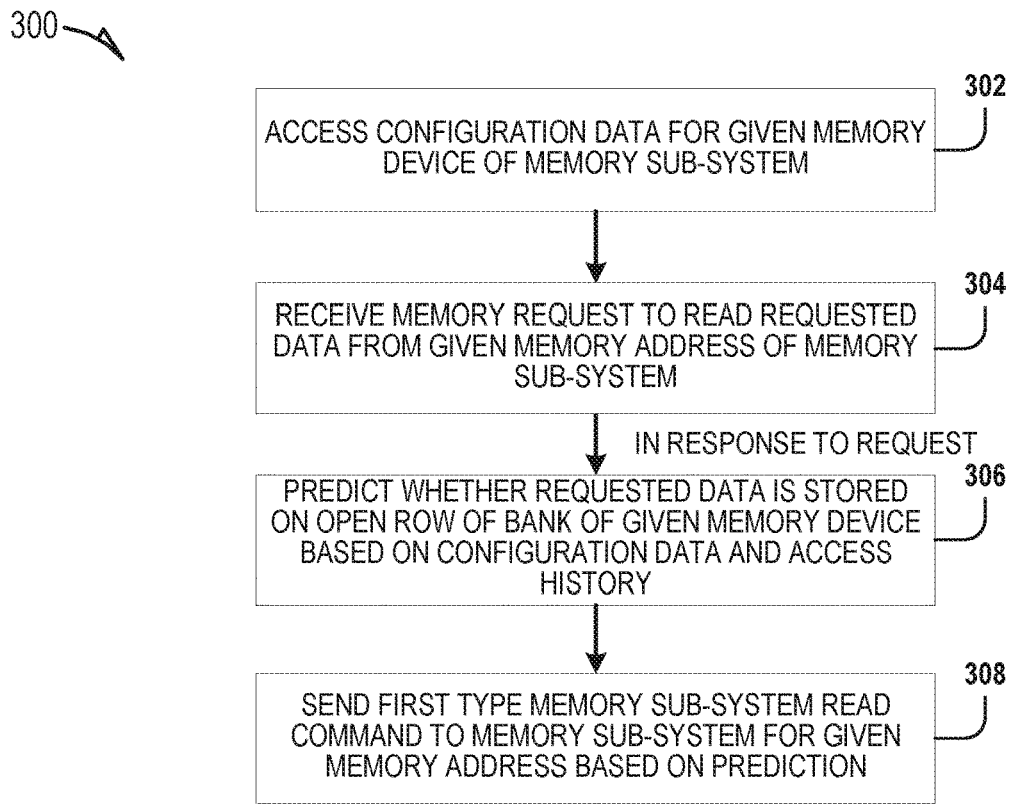
FIGS. 3 through 4 are flow diagrams of example methods for selectively sending a read command to a memory sub-system based on a predicted row status of a memory device of the memory sub-system, in accordance with some embodiments of the present disclosure.
Figure 4:
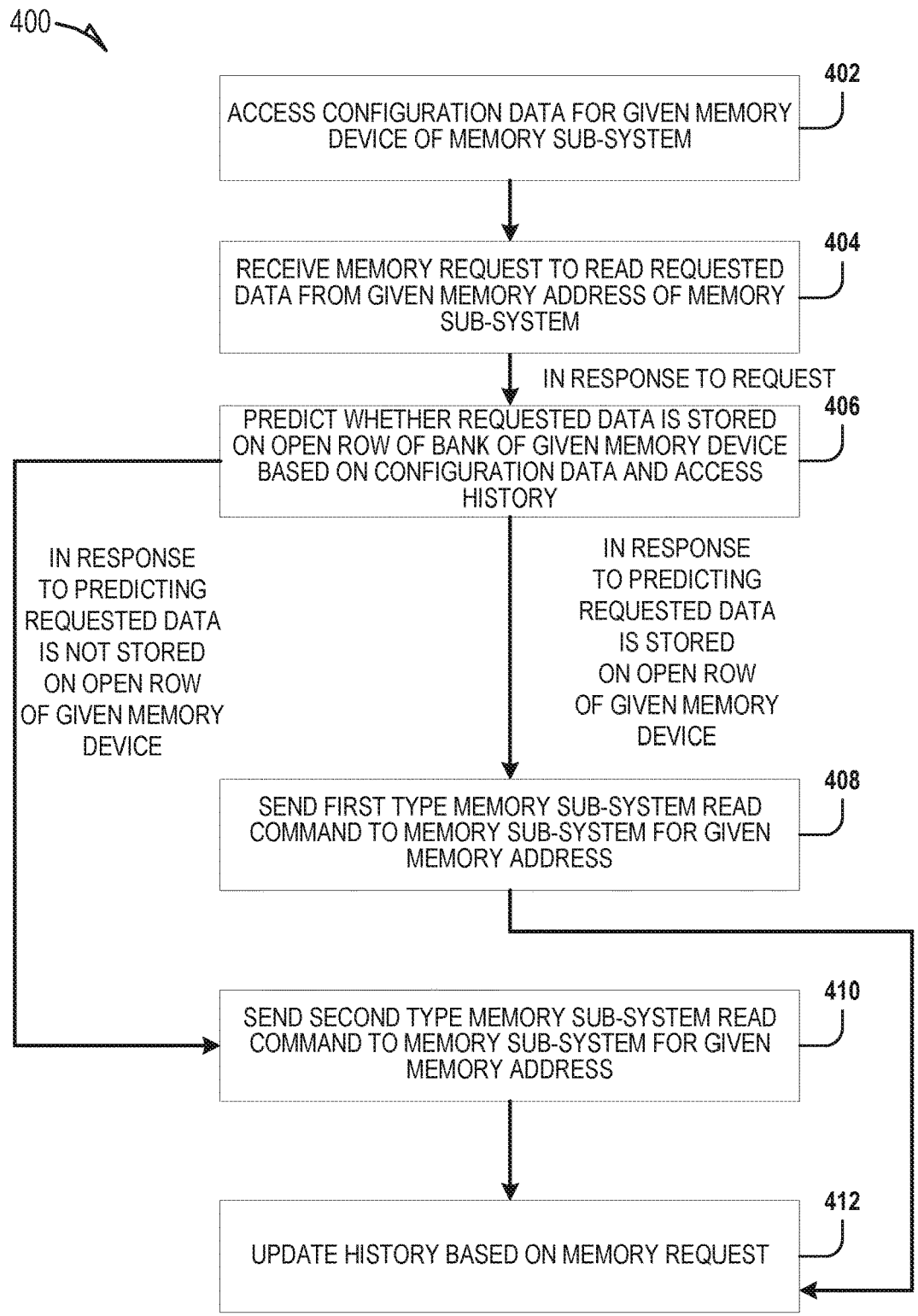

FIGS. 3 through 4 are flow diagrams of example methods for selectively sending a read command to a memory sub-system based on a predicted row status of a memory device of the memory sub-system, in accordance with some embodiments of the present disclosure. The methods 300, 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the methods 300, 400 are performed by the hardware memory controller 125 of the host system 120 as described with respect to FIG. 1. Additionally, or alternatively, for some embodiments, the methods 300, 400 are performed, at least in part, by the memory sub-system controller 115 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to the method 300 of FIG. 3, at operation 302, a hardware memory controller (e.g., 125) of a host system (e.g., 120) accesses configuration data for a given memory device (e.g., 114, 130, 140) of a memory sub-system (e.g., 110). As described herein, the configuration data can be provided to the hardware memory controller by the memory sub-system 110 (e.g., during a setup, startup, or discovery process). The configuration data can include, without limitation, an address map, time constraints, current page mode, and the like of the given memory device.

At operation 304, the hardware memory controller (e.g., 125) receives a memory request to read requested data from a given memory address of a memory sub-system (e.g., 110). In response to the memory request received at operation 304, at operation 306, the hardware memory controller (e.g., 125) predicts whether the requested data is stored on an open row of the given memory device based on the configuration data (accessed at operation 302) and a history of the hardware memory controller accessing the given memory device based on one or more memory requests previously processed by the hardware memory controller (e.g., access resulting from one or more memory sub-system commands being sent from the hardware memory controller to the memory sub-system). For some embodiments, the history is stored on a set of local memory devices (e.g., tracking memory devices 126) of the memory sub-system (e.g., 110). For some embodiments, operation 306 comprises determining, based on the configuration data and the history stored on the set of local memory devices, whether a given row of a given bank of the given memory device is open, where the given row of the given bank being associated with the given memory address of the memory request was received at operation 304. In particular, the hardware memory controller can determine that the requested data is stored on the open row of the given memory device in response to determining that the given row of the given bank of the given memory device is open, and can determine that the requested data is not stored on the open row of the given memory device in response to determining that the given row of the given bank of the given memory device is not open. Operation 304 can determine that the given row of the given bank of the given memory device is closed in response to determining that an entry stored on the history indicates that the last access of the given bank of the given memory device by the hardware memory controller involved another row of the given bank.

On the other hand, in response to determining that an entry stored on the history indicates that the last access of the given bank of the given memory device by the hardware memory controller involved a same row of the given bank as the given row of the given bank, operation 304 can determine that the given row of the given bank of the given memory device is open based on a current page mode of the given memory device. The hardware memory controller (e.g., 125) can determine a time difference between an access time associated with the last access of the given bank of the given memory, and a current time associated with the memory request received at operation 304. If the given memory device is in close page mode, the hardware memory controller can determine that the given row of the given bank of the given memory device is open in response to determining that the time difference is less than a delay time ($t_{delay\_to\_close}$) indicating how long the given memory device takes to close an individual row of an individual bank of the given memory device; the hardware memory controller can determine that the given row of the given bank of the given memory device is closed otherwise. If the given memory device is in open page mode, the hardware memory controller can determine that the given row of the given bank of the given memory device is open in response to determining that the time difference is less than the sum of the delay time ($t_{delay\_to\_close}$) and an open time ($t_{open}$) (indicating how long the given memory device keeps (e.g., holds) the individual row of the individual bank open, before closing the individual row, after there is no outstanding commands for the individual bank); the hardware memory controller can determine that the given row of the given bank of the given memory device is closed otherwise.

At operation 308, the hardware memory controller (e.g., 125) sends a first type of memory sub-system read command to the memory sub-system (e.g., 110) for the given memory address based on the predicting at operation 306. For some embodiments, operation 308 comprises sending, to the memory sub-system, the first type of memory sub-system read command for the given memory address in response to predicting that the requested data is stored on the open row of the given memory device. Additionally, for some embodiments, operation 308 comprises sending, to the memory sub-system, a second type of memory sub-system read command for the given memory address in response to predicting that the requested data is not stored on the open row of the given memory device. For instance, the first type of memory sub-system read command can include a cache-based memory sub-system read command (e.g., a speculative read (SREAD) command in accordance with a NVDIMM-P memory protocol), while the second type of memory sub-system read command can include a non-cache-based memory sub-system read command (e.g., an XREAD command in accordance with a NVDIMM-P memory protocol).

Referring now to the method 400 of FIG. 4, operations 402, 404, and 406 are similar to operations 302, 304, and 306 of the method 300 described above with respect to FIG. 3. In response to operation 406 predicting that the requested data is stored on an open row of the given memory device, the method 400 proceeds to operation 408; otherwise, the method 400 proceeds to operation 410.

At operation 408, the hardware memory controller (e.g., 125) sends a first type of memory sub-system read command, such as a cache-based command (e.g., SREAD command in accordance with a NVDIMM-P memory protocol), to the memory sub-system (e.g., 110) for the given memory address. After operation 408, the method 400 proceeds to operation 412.

At operation 410, the hardware memory controller (e.g., 125) sends a second type of memory sub-system read command, such as a non-cache-based command (e.g., XREAD command in accordance with a NVDIMM-P memory protocol), to the memory sub-system (e.g., 110) for the given memory address. After operation 410, the method 400 proceeds to operation 412.

At operation 412, the hardware memory controller (e.g., 125) updates the history (of the hardware memory controller accessing the given memory device based on one or more memory requests previously processed by the hardware memory controller) based on the memory request received at operation 404. For some embodiments, operation 412 comprises updating an existing (or generating a new) entry in the history for the specific bank (corresponding to the given memory address of the memory request received at operation 404) such that the entry indicates a last row accessed by the hardware memory controller (e.g., 125) as a result of processing the memory request received at operation 404.

Figure 5A:
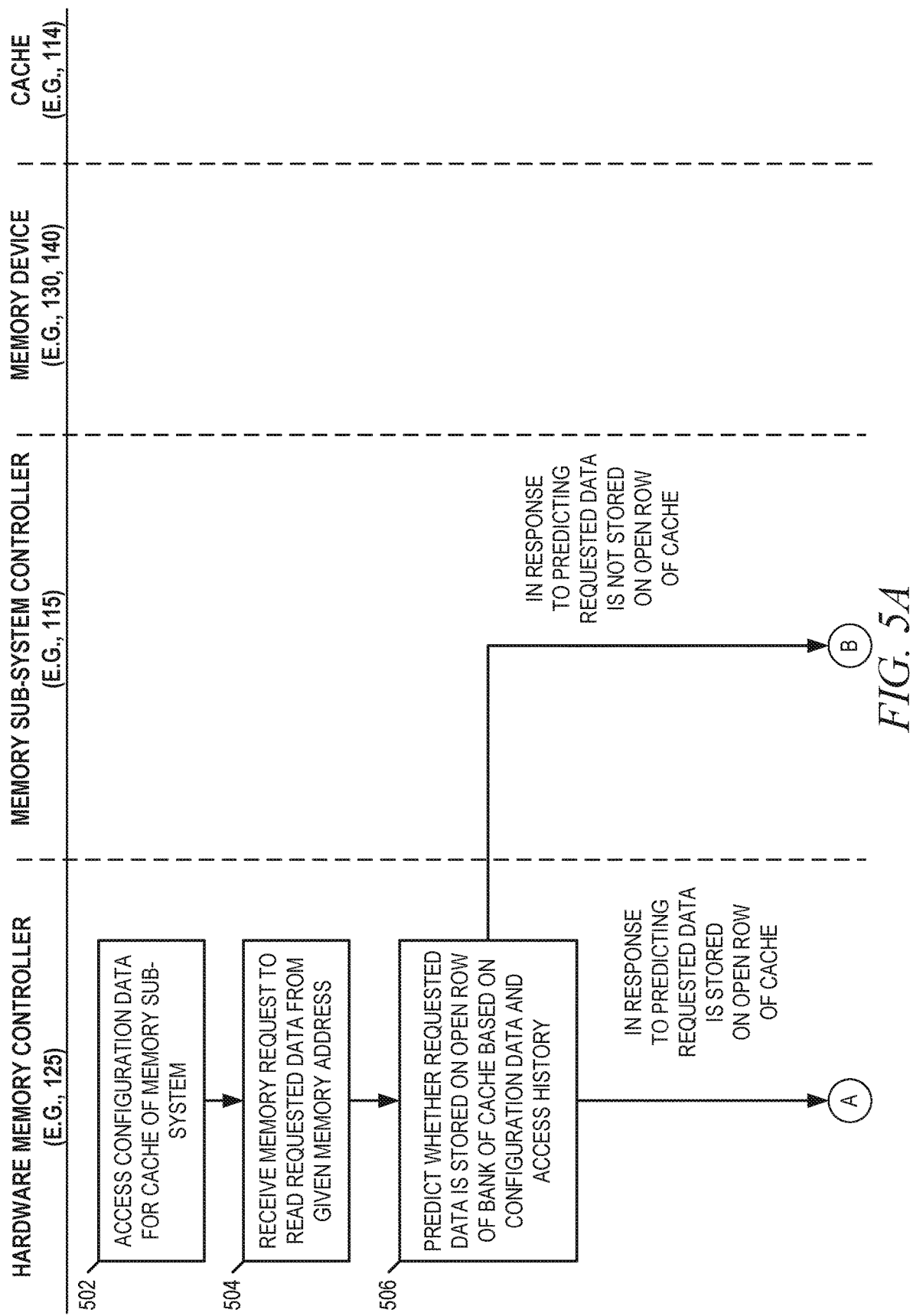
FIGS. 5A through 5C provide an interaction diagram illustrating interactions between components of the computing environment in the context of some embodiments in which a method for selectively sending a read command from a host system to a memory sub-system, based on a predicted row status of a memory device of the memory sub-system, is performed.
Figure 5B:
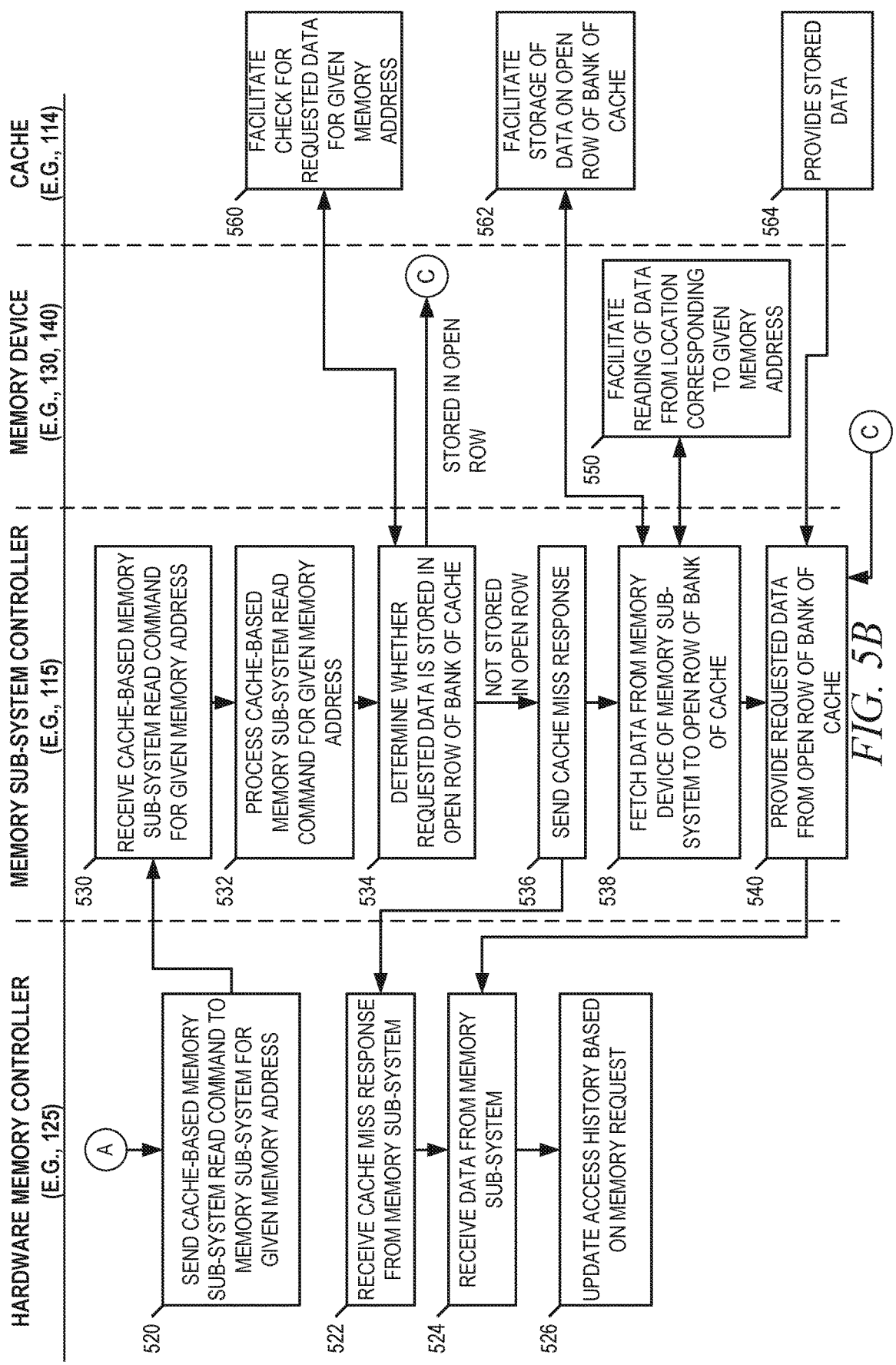
Figure 5C:
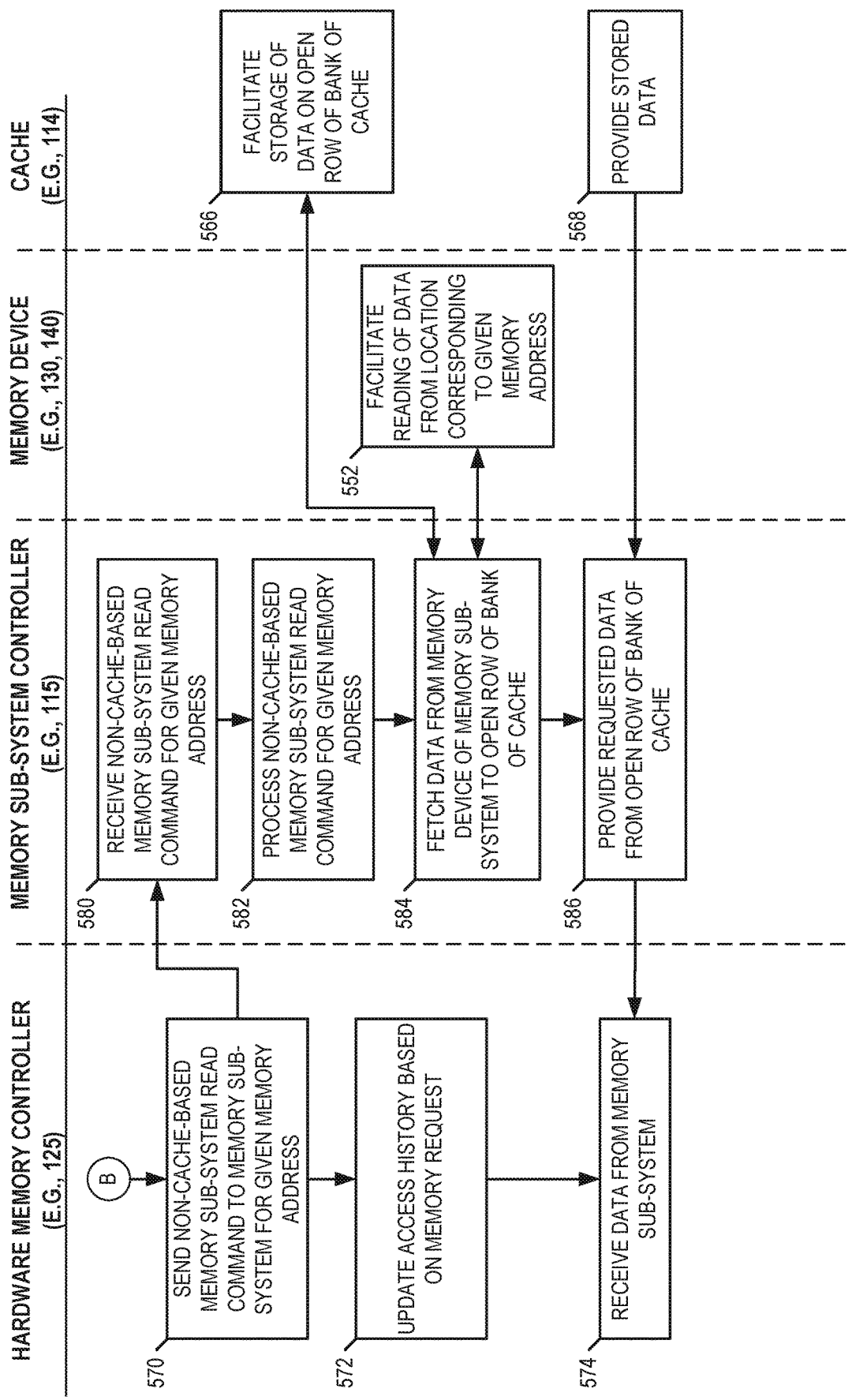

FIGS. 5A through 5C provide an interaction diagram illustrating interactions between components of the computing environment 100 in the context of some embodiments in which a method for selectively sending a read command from a host system to a memory sub-system, based on a predicted row status of a memory device of the memory sub-system, is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a hardware memory controller (e.g., 125) of a host system (e.g., 120), a memory sub-system controller (e.g., 115), a memory device (e.g., 130, 140), a cache (e.g., 114), or some combination thereof. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. In the context of the example illustrated in EEGs. 5A through 5C, the hardware memory controller can include the hardware memory controller 125, the memory sub-system controller can include the memory sub-system controller 115, the memory device can include the memory device 130 or 140, and the cache can include the cache 114.

As shown in FIG. 5A, at operation 502, the hardware memory controller 125 accesses configuration data (e.g., including address map, time constraints, page mode, etc.) for the cache 114 of the memory sub-system 110, which can comprise a DRAM device. At operation 504, the hardware memory controller 125 receives a memory request (e.g., from a processing device of the host system 120) to read requested data from a given memory address of the memory sub-system 110. At operation 506, the hardware memory controller 125 predicts whether the requested data is stored on an open row of a bank of the cache 114 based on the configuration data and a history of access of the cache 114 by the hardware memory controller 125.

Referring now to FIG. 5B, in response to predicting that the requested data is stored on an open row of a bank of the cache 114, at operation 520, the hardware memory controller 125 sends a cache-based memory sub-system read command to the memory sub-system 110 for the given memory address. At operation 530, the memory sub-system controller 115 of the memory sub-system 110 receives the cache-based memory sub-system read command for the given memory address. At operation 532, the memory sub-system controller 115 processes the cache-based memory sub-system read command for the given memory address. At operation 534, the memory sub-system controller 115 determines whether the requested data is stored in an open row of a bank of the cache 114. At operation 560, the cache 114 facilitates checking for the requested data for the given memory address on the cache 114. In response to determining that the requested data is stored on an open row of a bank of the cache 114, the method proceeds to operation 540. In response to determining that the requested data is not stored on an open row of a bank of the cache 114, the method proceeds to operation 536.

At operation 536, the memory sub-system controller 115 sends a cache miss response to the hardware memory controller 125 of the host system 120. At operation 538, the memory sub-system controller 115 fetches data from the memory device (e.g., 130, 140) to an open row of a bank of the cache 114. At operation 550, the memory device (e.g., 130, 140) facilitates reading of the data from the location corresponding to the given memory address, and at operation 562, the cache 114 facilitates storage of the data on an open of a bank of the cache 114.

At operation 540, the memory sub-system controller 115 provides the requested data from the open row of the bank of cache 114 to the hardware memory controller 125 of the host system 120. At operation 564, the cache 114 provides the memory sub-system controller 115 with the stored data from the open row of the bank of the cache 114. For some embodiments, operation 540 includes the memory sub-system controller 115 sending a response to the hardware memory controller 125 to indicate that the requested data is ready for sending to the host system 120 and sending the requested data to the host system 120 in response to the hardware memory controller 125 sending a send signal.

At operation 522, the hardware memory controller 125 receives a cache miss response from the memory sub-system controller 115. At operation 524, the hardware memory controller 125 receives data from the memory sub-system controller 115. At operation 526, the hardware memory controller 125 updates the history (of access of the cache 114 by the hardware memory controller 125) based on the memory request received at operation 504, and processed by the hardware memory controller 125, to reflect the access of the open row of the bank of the cache 114 based on the cache-based memory sub-system read command sent by operation 520.

Referring now to FIG. 5C, in response to predicting that the requested data is not stored on an open row of a bank of the cache 114, at operation 570, the hardware memory controller 125 sends a non-cache-based memory sub-system read command to the memory sub-system 110 for the given memory address. At operation 572, the hardware memory controller 125 updates the history (of access of the cache 114 by the hardware memory controller 125) based on the memory request received at operation 504, and processed by the hardware memory controller 125, to reflect the access of the open row of the bank of the cache 114 based on the non-cache-based memory sub-system read command sent by operation 570.

At operation 580, the memory sub-system controller 115 receives the non-cache-based memory sub-system read command for the given memory address. At operation 582, the memory sub-system controller 115 processes the non-cache-based memory sub-system read command for the given memory address. At operation 584, the memory sub-system controller 115 fetches data from the memory device (e.g., 130, 140) to an open row of a bank of the cache 114. At operation 552, the memory device (e.g., 130, 140) facilitates reading of the data from a location corresponding to the given memory address, and at operation 566, the cache 114 facilitates storage of the data on the open row of the bank of the cache 114.

At operation 586, the memory sub-system controller 115 provides the requested data from the open row of the bank of the cache 114 to the hardware memory controller 125 of the host system 120. At operation 568, the cache 114 provides the memory sub-system controller 115 with the stored data from the open row of the bank of the cache 114. At operation 574, the hardware memory controller 125 eventually receives the requested data from the memory sub-system 110.

Figure 6:
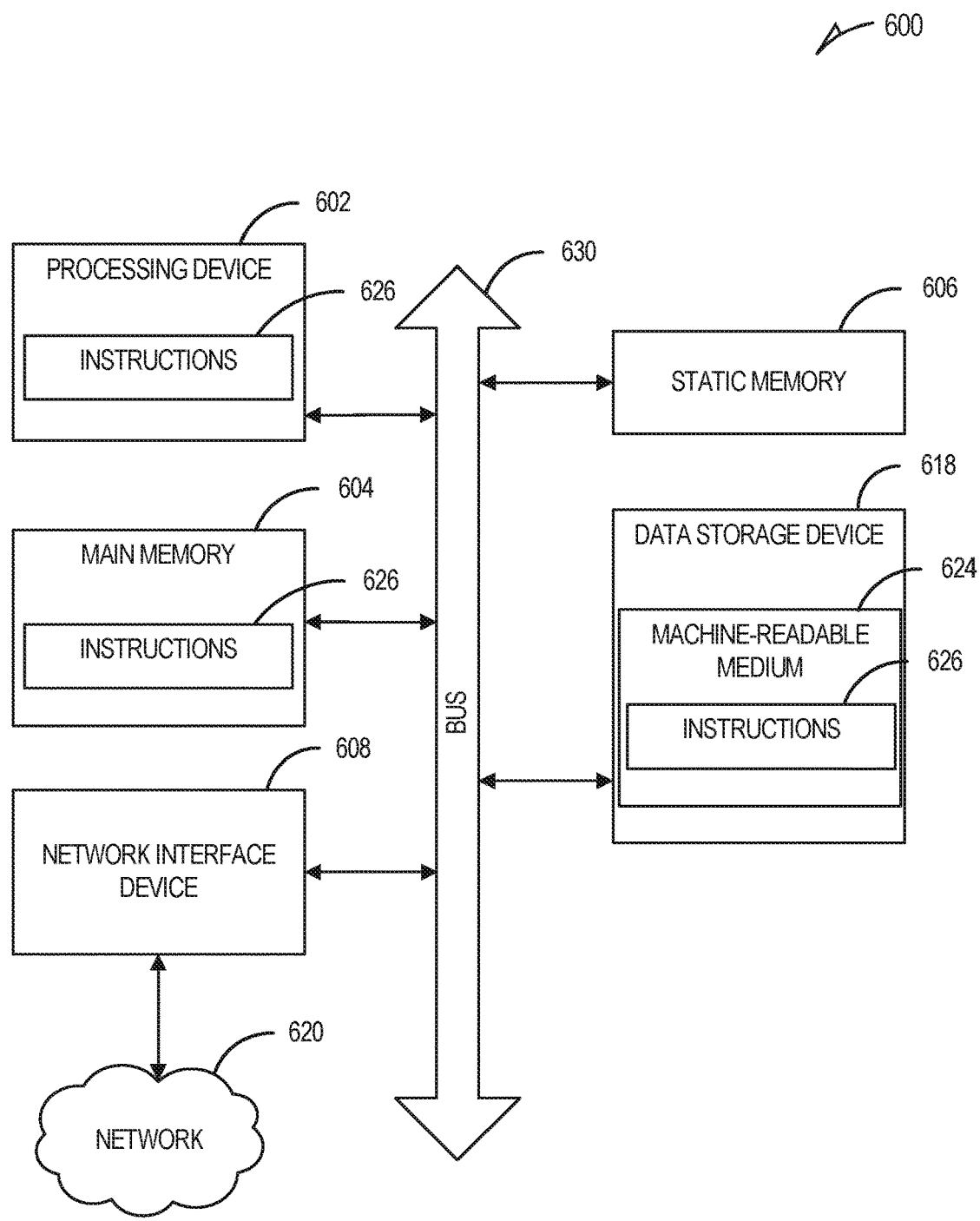
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to software). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage device 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage device 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage device 618, and/or main memory 604 can correspond to the memory sub-system 110 of FIG. 1.

In one embodiment, the instructions 626 include instructions to implement functionality relating to selectively sending a read command to a memory sub-system as described herein. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprises:
   a processing device; and
   a hardware memory controller for processing memory requests generated by the processing device, the hardware memory controller comprising:
      a set of local memory devices to store a history of the hardware memory controller accessing a given memory device of a memory sub-system based on one or more memory requests processed by the hardware memory controller, the memory sub-system being coupled to the hardware memory controller; and
      logic that performs operations comprising:
         accessing configuration data for the given memory device of the memory sub-system, the configuration data comprising an address map provided to the hardware memory controller by the memory sub-system;
         receiving a memory request to read requested data from a given memory address of the memory sub-system; and
         in response to receiving the memory request:
            predicting whether the requested data is stored on an open row of the given memory device based on the configuration data and the history stored on the set of local memory devices, the predicting comprising translating the given memory address to a given row of a given bank of the given memory device based on the address map; and
            sending a first type of memory sub-system read command to the memory sub-system for the given memory address based on the predicting whether the requested data is stored on the open row of the given memory device.

2. The system of claim 1, the given memory device operates as a cache of the memory sub-system.

3. The system of claim 2, wherein the first type of memory sub-system read command comprises a speculative read (SREAD) command in accordance with a Non-Volatile Dual In-Line Memory Module-P (NVDIMM-P) memory protocol.

4. The system of claim 1, wherein the sending the first type of memory sub-system read command to the memory sub-system for the given memory address based on the predicting whether the requested data is stored on the open row of the given memory device comprises:

sending, to the memory sub-system, the first type of memory sub-system read command for the given memory address in response to predicting that the requested data is stored on the open row of the given memory device.

5. The system of claim 1, wherein the operations further comprise:

sending, to the memory sub-system, a second type of memory sub-system read command for the given memory address in response to predicting that the requested data is not stored on the open row of the given memory device.

6. The system of claim 5, wherein the second type of memory sub-system read command comprises an XREAD command in accordance with a Non-Volatile Dual In-Line Memory Module-P (NVDIMM-P) memory protocol.

7. The system of claim 1, wherein the history comprises an entry for a prior access of the given memory device by the hardware memory controller in response to a previously processed memory request for a target memory address, the entry describing a bank and a row of the given memory device accessed by the hardware memory controller, the bank and the row of the given memory device being associated with the target memory address.

8. The system of claim 1, wherein the predicting whether the requested data is stored on the open row of the given memory device based on the configuration data and the history stored on the set of local memory devices comprises:

determining, based on the configuration data and the history stored on the set of local memory devices, whether the given row of the given bank of the given memory device is open.

9. The system of claim 8, wherein the determining, based on the configuration data and the history stored on the set of local memory devices, whether the given row of the given bank of the given memory device is open comprises:

determining that the requested data is stored on the open row of the given memory device in response to determining that the given row of the given bank of the given memory device is open.

10. The system of claim 8, wherein the determining, based on the configuration data and the history stored on the set of local memory devices, whether the given row of the given bank of the given memory device is open comprises:

determining that the requested data is not stored on the open row of the given memory device in response to determining that the given row of the given bank of the given memory device is not open.

11. The system of claim 8, wherein the determining, based on the configuration data and the history stored on the set of local memory devices, whether the given row of the given bank of the given memory device is open comprises:

determining, based on the configuration data and the history stored on the set of local memory devices, whether any entry stored on the history indicates that a last access of the given bank of the given memory device by the hardware memory controller involved any other row of the given bank.

12. The system of claim 11, wherein the determining, based on the configuration data and the history stored on the set of local memory devices, whether the given row of the given bank of the given memory device is open further comprises:

determining that the given row of the given bank of the given memory device is closed in response to determining that an entry stored on the history indicates that the last access of the given bank of the given memory device by the hardware memory controller involved another row of the given bank.

13. The system of claim 11, wherein the determining, based on the configuration data and the history stored on the set of local memory devices, whether the given row of the given bank of the given memory device is open further comprises:

in response to determining that an entry stored on the history indicates that the last access of the given bank of the given memory device by the hardware memory controller involved a same row of the given bank as the given row of the given bank:

determining, based on the entry stored on the history, an access time associated with the last access of the given bank of the given memory device;

determining a page mode of the given memory device; and determining whether the given row of the given bank of the given memory device is open based on the access time and the page mode of the given memory device.

14. The system of claim 13, wherein the determining whether the given row of the given bank of the given memory device is open based on the access time and the page mode of the given memory device comprises:

determining a time difference between the access time and a current time associated with the memory request;

determining whether the time difference is less than a delay time, the delay time indicating how long the given memory device takes to close an individual row of an individual bank of the given memory device; and in response to determining that the page mode comprises a close page mode, determining that the given row of the given bank of the given memory device is open based on the determining whether the time difference is less than the delay time.

15. The system of claim 13, wherein the determining whether the given row of the given bank of the given memory device is open based on the access time and the page mode of the given memory device comprises:

determining a time difference between the access time and a current time associated with the memory request;

determining whether the time difference is less than a sum of a delay time and an open time, the delay time indicating how long the given memory device takes to close an individual row of an individual bank of the given memory device, and the open time indicating how long the given memory device keeps the individual row of the individual bank open before closing the individual row; and in response to determining that the page mode comprises an open page mode, determining that the given row of the given bank of the given memory device is open based on the determining whether the time difference is less than the sum of the delay time and the open time.

16. The system of claim 1, wherein the set of local memory devices further stores one or more memory addresses associated with one or more past memory sub-system commands sent to the memory sub-system from the hardware memory controller, and wherein the predicting whether the requested data is stored on the open row of the given memory device is further based on the one or more memory addresses stored on the set of local memory devices.

17. The system of claim 16, wherein the predicting whether the requested data is stored on the open row of the given memory device based on the configuration data, the history stored on the set of local memory devices, and the one or more memory addresses stored on the set of local memory devices comprises:
 predicting, based on the one or more memory addresses stored on the set of local memory devices, whether the requested data is stored on the given memory device; and
 in response to predicting that the requested data is stored on the given memory device:
  determining, based on the configuration data and the history stored on the set of local memory devices, whether the given row of the given bank of the given memory device is open; and
  determining that the requested data is stored on the open row of the given memory device in response to determining that the given row of the given bank of the given memory device is open.

18. A hardware memory controller comprising:
 a hardware interface for receiving a memory request generated by a processing device;
 a set of local memory devices to store a history of the hardware memory controller accessing a given memory device of a memory sub-system based on one or more memory requests processed by the hardware memory controller, the memory sub-system being coupled to the hardware memory controller; and
 logic that performs operations comprising:
  accessing configuration data for the given memory device of the memory sub-system, the configuration data comprising an address map provided to the hardware memory controller by the memory sub-system;
  receiving the memory request to read requested data from a given memory address of the memory sub-system; and
  in response to receiving the memory request:
   predicting whether the requested data is stored on an open row of the given memory device based on the configuration data, and the history stored on the set of local memory devices, the predicting comprising translating the given memory address to a given row of a given bank of the given memory device based on the address map; and
   sending a first type of memory sub-system read command to the memory sub-system for the given memory address based on the predicting whether the requested data is stored on the open row of the given memory device.

19. A method comprising:
 accessing, by a hardware memory controller, configuration data for a given memory device of a memory sub-system coupled to the hardware memory controller, the hardware memory controller comprising a set of local memory devices to store a history of the hardware memory controller accessing the given memory device based on one or more memory requests processed by the hardware memory controller, the configuration data comprising an address map provided to the hardware memory controller by the memory sub-system;
 receiving, at the hardware memory controller, a memory request to read requested data from a given memory address of the memory sub-system; and
 in response to receiving the memory request:
  predicting, by the hardware memory controller, whether the requested data is stored on an open row of the given memory device based on the configuration data, and the history stored on the set of local memory devices, the predicting comprising translating the given memory address to a given row of a given bank of the given memory device based on the address map;
  sending, by the hardware memory controller, a first, type of memory sub-system read command to the memory sub-system for the given memory address based on the predicting whether the requested data is stored on the open row of the given memory device; and
  updating, by the hardware memory controller, the history based on the memory request.

20. The method of claim 19, wherein the predicting whether the requested data is stored on the open row of the given memory device based on the configuration data and the history stored on the set of local memory devices comprises:
 determining, based on the configuration data and the history stored on the set of local memory devices, whether the given row of the given bank of the given memory device is open.

* * * * *